United States Patent [19]

McKee et al.

[11] Patent Number: 5,479,018

[45] Date of Patent: Dec. 26, 1995

[54] BACK SURFACE ILLUMINATED INFRARED DETECTOR

[75] Inventors: Richard C. McKee, Glenwood; Leslie L. Thompson, Bowie, both of Md.; Dayton D. Eden, Dallas, Tex.; William E. Case, Arlington, Tex.; Thomas R. Schimert, Grand Prairie, Tex.

[73] Assignee: Westinghouse Electric Corp., Pittsburgh, Pa.

[21] Appl. No.: 348,939

[22] Filed: May 8, 1989

[51] Int. Cl.$^6$ .............................. H01L 27/14; G01J 5/20
[52] U.S. Cl. .................... 250/338.1; 250/370.01; 250/370.12; 250/370.13; 250/338.4; 250/349
[58] Field of Search .................. 250/370.01, 370.08, 250/370.12, 370.13, 338.4, 338.1, 332, 349; 357/30

[56] References Cited

U.S. PATENT DOCUMENTS

| | | | |
|---|---|---|---|
| 3,953,137 | 4/1976 | Balut et al. | 356/222 |
| 4,255,659 | 3/1981 | Kaufman et al. | 250/370.09 |
| 4,469,945 | 9/1984 | Hoeberechts et al. | 250/370.01 |
| 4,731,640 | 3/1988 | Bluzer | 357/30 |
| 4,801,802 | 1/1989 | Dyson | 250/330 |
| 4,875,084 | 10/1989 | Tohyama | 357/30 |

*Primary Examiner*—Constantine Hannaher
*Assistant Examiner*—Edward J. Glick

[57] ABSTRACT

An infrared detector, having improved infrared absorptance and operating performance at or near ambient as well as the cryogenic temperature ranges. The infrared detector, in one embodiment includes a multi-filament HgCdTe detector region mounted upon a CdTe substrate, a metallic reflective region placed in front of, or behind, the HgCdTe detection region forming a resonant layer between the reflective region and HgCdTe. Electrical contacts operable to detect the change in resistance of the HgCdTe detector filaments are connected to the detector region. Embodiment for a back surface illuminated detector device is described for use in the 8 micron to 12 micron, longwave infrared (LWIR) range. Improved operation in the LWIR range at higher temperatures results in detector arrays having decreased cooling needs and infrared detector systems produced with a significant decrease in overall system weight.

7 Claims, 5 Drawing Sheets

BACK SURFACE ILLUMINATED INFRARED DETECTOR

BACKGROUND OF THE INVENTION

1. Field of the Invention

The present invention relates to a infrared detectors, specifically infrared detectors operable across a wide temperature range having either improved performance at the cryogenic temperatures or useful performance at near room temperature operation.

2. Description of the Prior Art

Copending applications have been filed by common inventors for related subject matter. Application Serial No. 07/092,736, entitled "Bandgas Radiation Detector" was filed on Aug. 5, 1987 by Dayton Eden and William Case. Copending application Serial No. 06/901,071 entitled "Uncooled Infrared Detector" was filed on Jul. 14, 1986.

The detection of infrared energy particularly from targets near or around room temperature, in the midwave and longwave infrared range using focal plane detectors that can operate warmer than 200° K. is extremely desirable in avionic and space based applications.

The best detectors in the infrared range, have in the past required significant cooling capability in the liquid nitrogen temperature range of less than 100° K. so that they might operate at peak performance. Their detector performance radically decreased as they are operated at closer to room temperatures, which detectors include uncooled conventional photoconductive or photovoltaic HgCdTe detectors, bolometers, and pyroelectric arrays do not achieve the same detectivity as the cryogenic detectors. Their performance is poorer by at least two orders of magnitude due to limitations in the detection mechanisms and noise sources when operating near room temperature.

Any object, animate or inanimate emits infrared energy. The atmosphere above the earth is transparent in two spectral regions to the radiation in the mid-wavelength infrared (MWIR) and the longwave infrared wavelength (LWIR) bands. A body of temperature 300° K., again mechanical or human, emits the peak of its radiation in the longwave infrared (LWIR) band. The longwave infrared range of detection is in the 8 micron ($\mu$) to 12 micron ($\mu$) range. The midwave infrared is in the 3 micron ($\mu$) to 5.3 micron ($\mu$) range.

Conventional state-of-the-art photosensitive infrared detectors are typically fabricated out of 10 $\mu$ (micron) thick bulk or epitaxial layers to maximize the absorption efficiency. Detectors are then delineated by appropriate means in these layers. Typically for detectors which are operating in a "detector limited" performance region, the largest contributing noise source comes from thermal generation-recombination, noise (thermal g-r noise), which results from carrier density fluctuations. Detectivity of a detector is described by using a combination of response and noise measurements analytically formulated to define a function called D* (D-star).

The D* associated with a thermal g-r limited detector goes as proportional to the inverse square root of the volume of the detector. Thus, if one can reduce the detector volume while maintaining a high absorption and providing high quantum efficiency, then the detectors performance can be improved. This can be done by patterning the active detector material into an array type structure with resonant characteristics. The volume of the detector material in this resonant detector is thereby reduced not only because the active area is reduced but also because it can be made substantially thinner while maintaining a high absorption cross section and thus high quantum efficiency.

Advances in lithography have made it possible to apply and scale these microwave concepts to the infrared region. The performance improvements which result from applying microwave concepts to the infrared provides D* values improved over the state of the art detectors operating at cryogenic temperatures.

Conversely, the operating temperature of a resonant structure can be raised significantly toward the room temperature level to provide a D* equivalent to the current state of art detectors which would be operating at 77° K.

The problem to be solved therefore, is the problem of producing an array of infrared detectors that are operable in the 3 micron ($\mu$) to 5 micron ($\mu$) midwave infrared (MWIR) spectral region or 8 micron ($\mu$) to 12 micron ($\mu$) longwave infrared region (LWIR) that are; (1) responsive with low noise at higher operating temperatures; (2) require less cooling equipment to achieve performance as found in the prior art. Simultaneously, it would be advantageous to have an infrared detector operable effectively in a wide temperature range.

The following articles include subject matter which may be related to the technology disclosed herein.

1. D. B. Rutledge and S. E. Schwarz, "Planar Multimode Detector Arrays for Infrared and Milimeter-Wave Applications", IEEE Journal of Quantum Electronics, Vol. QE-17, No. 3, March, 1981, pp. 407–413.

2. J. N. Schulman and T. C. McGill, "The CdTe/HgTe Superlattice: Proposal for New Infrared Material", Appl. Phys. Lett. 34 (10), May 15, 1979, pp. 663–665.

3. J. P. Faurie, S. Sivananthan, M. Boukersche and J. Reno, "Molecular Beam Epitaxial Growth of High Quality HgTe and Hg (1–x) Cd(x) Te Onto GaAs (001) Substrates", Appl. Phys. Left. 45 (12), Dec. 15, 1984, pp. 1307–1309.

4. D. L. Smith, D. K. Arch, R. A. Wood, and M. Walter Scott, "HgCdTe Heterojunction Contact Photoconductor", Appl. Phys. Lett. 45 (1), Jul. 1, 1984, pp. 83–85.

5. D. L. Smith, "Theory of Generation-Recombination Noise in Intrinsic Photoconductors", J. Appl. Phys. 53 (10), Oct., 1982, pp. 7051–7060.

A solution to these problems is presented by the preferred embodiment of this invention which, while applicable particularly to the longwave infrared range, would also function in the midwave infrared spectral and longer wavelength infrared spectral ranges.

SUMMARY OF THE INVENTION

The present invention is directed to the high performance detection and absorption of mid-wave and long-wave infrared energy utilizing a back surface illuminated infrared resonant mesh detector. This device also may be referred to as a "strip array" structure.

Key components of the back surface illuminated mesh detectors include the following elements. An infrared transparent substrate. A detector region, consisting of a resonant mesh structure made up of a multiplicity of parallel, end connected, photoconductive strips. A reflector is mounted either above the detector region with an open gap or a back illuminated design is used wherein a resonant cavity is formed between the detector region and the reflector. The resonant cavity provides enhanced absorption of the light by providing an impedance match between the detector and the freely propagating incident light exterior to the cavity. The resonant cavity formed between the reflector and the detector region can be adjusted in thickness to match the impedance of the resonant mesh detector to that of free space over the spectral band of operation (for example, the 8–12 micron LWIR band) thereby maximizing the absorption of infrared light in the band. The detector region is operable to read out the changes in resistivity for the detector region as a result of its absorptance of the infrared photons.

A specific embodiment in the LWIR range includes the following components. A cadmium telluride (CdTe) or cadmium zinc telluride (CdZnTe) substrate which is transparent to long-wave infrared (LWIR) energy during detector operation. A cavity structure formed by air, as in a back surface illuminated design. In the back surface illuminated design, the mirror is positioned above the detector region and separated by an open gap. A mercury cadmium telluride (HgCdTe) resonant mesh detector array detector for the backside structure is a set of parallel HgCdTe strips spaced nominally 3 to 4 microns apart, 0.5 to 1.5 micron wide and 0.5 micron thick with a filament length of greater than 50 microns in length. These strips of mercury cadmium telluride (HgCdTe) are connected together at the ends in parallel. The design space has a range of values about this specific set of physical parameters. Electrical contacts abut the opposing ends of the parallel filament strips of mercury cadmium telluride. These electrical contacts for the detectors enable electrical bias and output of signals received by the infrared detector to be transmitted to the outside. These contacts could be fabricated of indium, chromium indium or gold chromium indium.

The back surface illuminated long-wave infrared detector is shown by FIG. 2 wherein the LWIR light is incident on the detector region through a cadmium telluride substrate 40. A strip array 55 is etched from a HgCdTe film formed on the surface of the cadmium telluride. A gap is formed above the detector structure by a separate substrate 44 of cadmium telluride which has a reflective mirror 48 (such as chromium) evaporated on its bottom side, the side facing the strip array structure. An aluminum mechanical spacer 58 with adhesive attachment posts 43 serves as a support structure. The resonant cavity is formed between the substrate of cadmium telluride and the strip array structure. Indium (In) columns 42 are cold welded together to affix the mirror to the substrate containing the strip array structure.

Light enters through the transparent cadmium telluride to the resonant mesh detector. The detector structure is a mercury cadmium telluride (HgCdTe) strip array. The strips are spaced approximately 3 microns apart, have a strip width of approximately 1.0 micron ($\mu$) and a thickness of approximately 0.5 micron ($\mu$). The strips are end connected together in parallel by pads of mercury cadmium telluride. The mercury cadmium telluride (HgCdTe) pads are interconnected to electrical contacts.

In a test structure design, the overall size is approximately 200 micron×200 micron. In the back surface illuminated design, the overall size is approximately 200 micron×200 micron. In the back surface illuminated design, the mercury cadmium telluride strips reside on a cadmium telluride (CdTe) substrate and are ohmically connected with metal electrodes at the end of the strips. Depending upon the doping of the HgCdTe detector material as either n type or p type the metal connecting structure will be indium or gold.

Operation of this device is like that of a photoconductor in which the incident radiation is directed toward the infrared detector through the back side. The mirror assembly chip is above the mercury cadmium telluride strip array. This mirror chip is adhered to the chip containing the mercury cadmium telluride strips resulting in a 1.5 micron plus or minus 1 micron thick gap, between the mirror and the strips.

The performance of the back surface illuminated detector has been modeled for the structure shown in FIG. 2. This modeling was performed with the structure configured with the mirror residing above the filament detector.

The model detectivity in the 8 micron to 12 micron infrared band of this detector structure having filament width of 0.5 micron ($\mu$), a pitch of 3 micron and a film thickness of a 0.5 micron ($\mu$) with a mirror separation gap of 1 micron is shown in FIG. 8. Detectivity for this model was calculated assuming a total flux in the 8 micron to 12 micron band of 10 photons per second per centimeter squared. An array comprising a multiplicity of back surface illuminated detectors is described and claimed. Although this describes a preferred embodiment fabricated using HgCdTe or CdTe or CdZnTe substrates, to others skilled in the art it will be obvious that other detector materials and detector materials used in modes other than the photoconductive mode can be implemented in this structure.

BRIEF DESCRIPTION OF THE DRAWINGS

For a better understanding of the invention, reference may be had to the preferred embodiment, exemplary of the invention, shown in the accompanying drawings, in which.

DESCRIPTION OF THE PREFERRED EMBODIMENT

Figure 1:
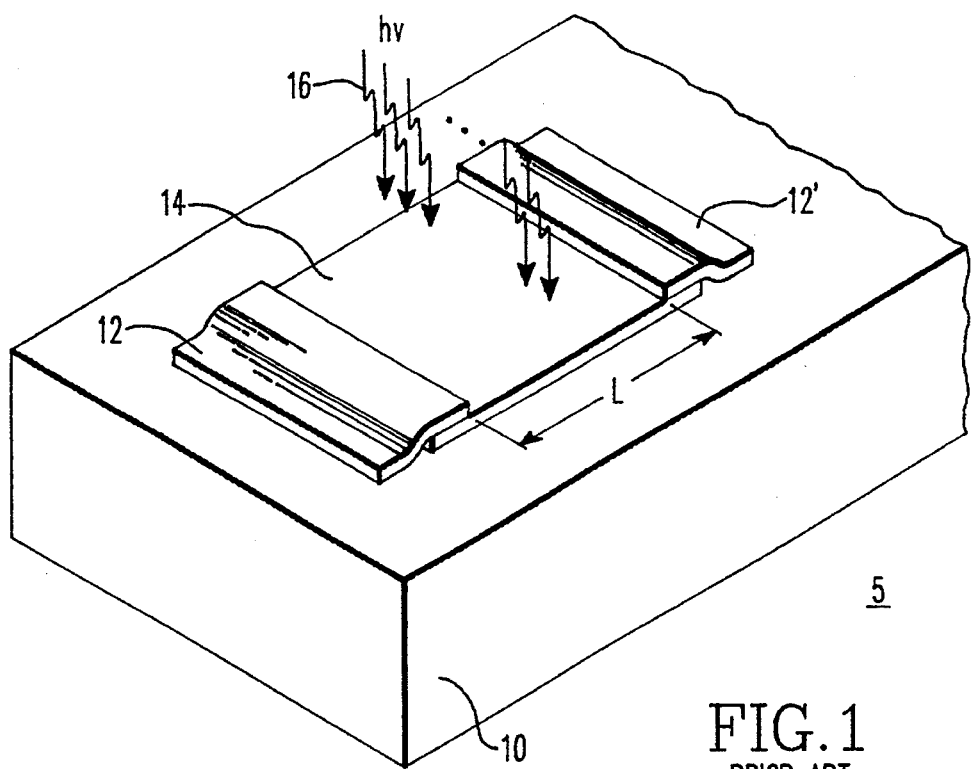
FIG. 1 is a isometric view of the prior art, a conventional photoconductive infrared detector structure.

FIG. 1 is an isometric view of a conventional infrared photoconductive detector 5. Detector 5 is designed to collect infrared energy 16 from outside of the detector 5. The detector includes a cadmium telluride (CdTe) substrate layer 10 which serves as a base for the epitaxial growth of mercury cadmium telluride (HgCdTe) photodetective layer 14. This process is described in the previously noted article to Faurie et al.

Figure 2:
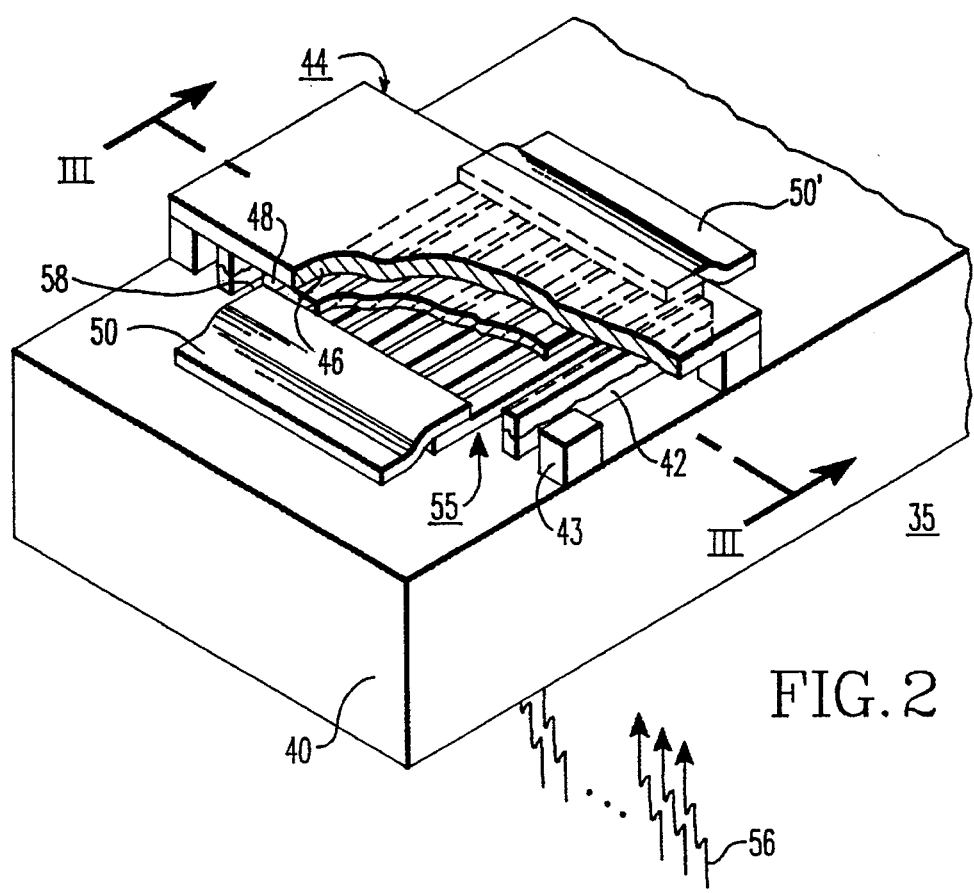
FIG. 2 is an isometric view of the preferred embodiment, a back surface illuminated detector having a cross section taken along line III—III.
Figure 3:
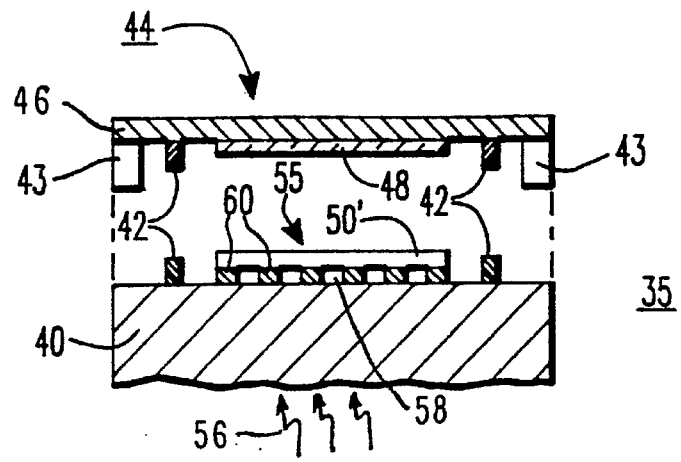
FIG. 3 is a cross sectional view taken along line III—III of the back surface illuminated detector as shown in FIG. 2.

The conventional infrared detector 5 as shown in FIG. 1 is front surface illuminated. Infrared radiation 16 strikes a mercury cadmium telluride (HgCdTe) detector layer 14 from above. The detector layer which operates functionally, as a resistor having resultant resistance change when exposed to the infrared radiation 16. Metal contacts, such as gold (Au) or indium (In) contacts 12, 12' allow changes in the HgCdTe resistance to be detected by a voltage change when operated with a constant bias current. In this example, the conventional infrared detector 5 is seen having a 50 micron (μ) length for the single filament detector slab 14 of mercury cadmium telluride (HgCdTe) substrate FIG. 2 is an isometric view of the preferred embodiment of this infrared detector device, a back surface illuminated, detector, 35 having cross section III—III. A substrate 40 of cadmium telluride (CdTe) again serves as a substrate transparent to the incident infrared light 56 in this embodiment. A mercury cadmium telluride (HgCdTe) strip array structure 55 is etched from an epitaxially grown mercury cadmium telluride (HgCdTe) film upon the cadmium telluride (CdTe) substrate 40. A subchip, 44 of cadmium telluride (CdTe) is mounted directly above, and fully covering the mercury cadmium telluride strip structure 55. This subchip, 44 of cadmium telluride is attached by indium posts 42 which are cold welded together during fabrication. This cadmium telluride subchip 44, comprises a substrate of cadmium telluride 46, and a mirrored surface of chrome (Cr) 48 layered upon the underside. The distance between the filament structure 55 of mercury cadmium telluride and the reflective means 48 comprising the evaporated chrome (Cr) mirror on the underside of the substrate 46 produces a nominally resonant cavity to the LWIR radiation. This resonant cavity 58 is similar, to the cavity formed using the layer 40 of cadmium telluride formed upon the underside of the filament structure 60 as shown in FIG. 3. Aluminum stops 43 further support the subchip structure 44, and gauge the separation.

Again, as shown in FIG. 2 the back surface illuminated detector 35, collects infrared light 56 through the cadmium telluride substrate 40 which is transparent in the 8 to 12 micron range. The light 56 passes through the cadmium telluride substrate 40 onto the mercury cadmium telluride strip array detector structure 55. The mirror 48 serves to impedance match the structure 55 to that of the freely propagating incident light by enhancing absorptance. As with the front side illuminated device of FIG. 1, this back surface illuminated structure 35 operates as a common photodetector in that, a resistance change occurs due to the photons 56 striking the mercury cadmium telluride structure 55. This change in electrical resistance can be detected by peripheral equipment connected to the metal contacts 50 and 50'.

FIG. 3 is a cross sectional view taken along line III—III of the back surface illuminated detector 35 as shown in FIG. 2. In this particular implementation two pairs of indium posts 42 are aligned upon the the subchip structure 44 and substrate 40. During detector 35 fabrication, the mirror substrate 46 and the CdTe subchip structure 44 are squeezed together, cold welding the indium posts 42 together. The aluminum stops 43 provide and maintain the predetermined distance between substrate 40 for the strip array and subchip 44 forming a resonant cavity 58. The metal mirror 48 formed on the subchip substrate 46 can be seen mounted directly over detector region 55. Electrical metal contact 50' serves to connect detector 55 to peripheral input/output equipment.

Figure 4:
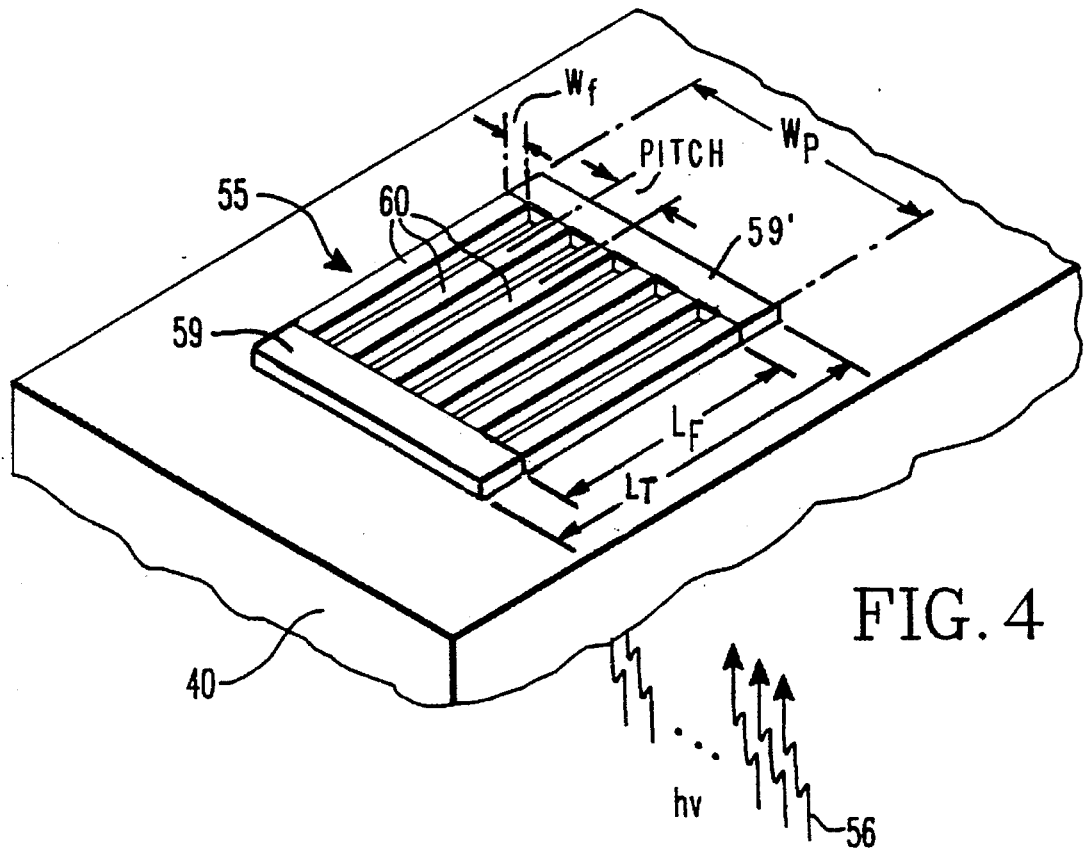
FIG. 4 is an isometric view of the mesh detector region as it appears in the back surface illuminated detector, specifically in the 3 micron (pitch) spacing×0.5 micron wide filament design.

FIG. 4 is an isometric view of the mercury cadmium telluride (HgCdTe) detector structure 55 as used in the back surface illuminated device 35 of FIGS. 2 and 3. This mercury cadmium telluride (HgCdTe) structure 55 comprises two rectangular contact pads of mercury cadmium telluride 59, 59'. Interconnected between the two contact pads 59, 59' of mercury cadmium telluride are a multiplicity of individual strips 60 also comprised of mercury cadmium telluride. These individual strips have a distinct, predetermined length, width, and depth. Also, a predetermined pitch between each strip 60, is calculated and maintained.

The specific example as shown in this embodiment for FIG. 4 has a multiplicity of strips having a uniform length which in this figure is shown to be 200 microns, $L_f$, a uniform strip width per each strip of $W_f$, here approximately 0.5 microns, a depth per each strip of approximately 0.5 microns with approximately 3 microns pitch for the strip array 60. In this figure a strip array whose physical extent spans a 200 μ×200 μ compose one detector. Physical extents at less than 200 microns (μ) are permitted and rectangular aspect ratios can be achieved. These values are selected to provide a test structure of convenient dimensions. In this figure a strip array having an array width $w_p$ by strip length $L_f$= 200μ×200 μ composes one detector. This structure of mercury cadmium telluride 55 is mounted upon a cadmium telluride layer 40, which is of course, transmissive to the photons of energy 56. Thus, overall detector dimension of the infrared detector region 55 of this device is approximately 200 microns with the total length $L_T$ of HgCdTe being extended by the length of the contact pads 59 and 59'.

The detectors performance characteristics will depend upon the material used to fabricate the detector region and the detector substrate. A detector operable in the mid-wave infrared range could have a detector region fabricated out of indium antimonide (InSb) on a gallium arsenide (GaAs) substrate instead of a HgCdTe technology. The long-wave infrared detectors could operate successfully with a detector region of gallium doped silicon (Si) on an undoped silicon (Si) substrate.

Any highly reflective metal in the infrared wavelength, such as silver (Ag), gold (Au), chromium (Cr) and palladium (Pd) would be operable to serve as the reflective means for the back surface illuminated detectors.

The material forming the resonant cavity, between the detector region and the reflective means may be fabricated of numerous materials. Each material would have a unique refractive index. Common materials having various refractive indices include, vacuum 1, air 1, cadmium telluride (CdTe) 2.7; and undoped silicon (Si) 3.5.

Figure 5:
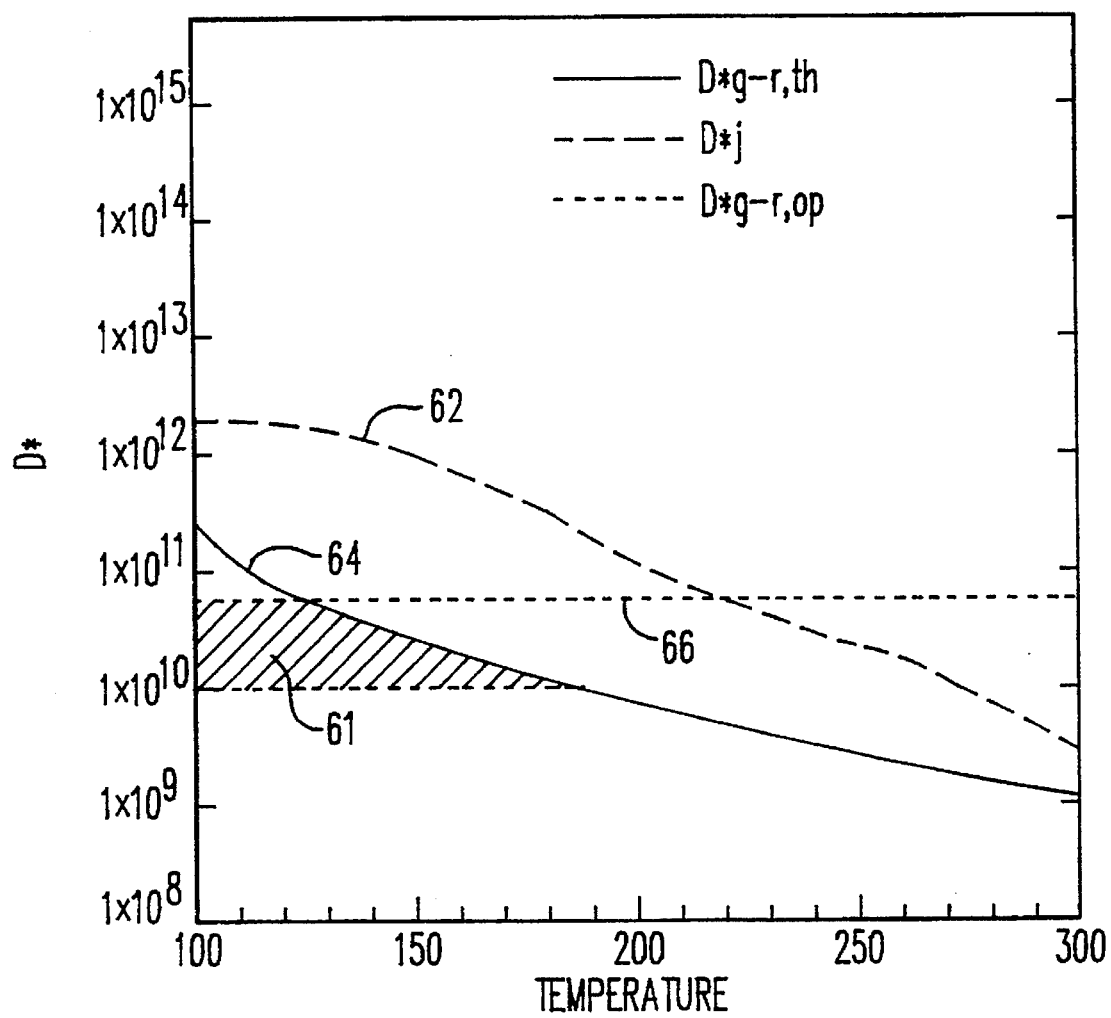
FIG. 5 is a graph of detectivity versus temperature and strip width and thickness for the D* modeled for the back surface illuminated detector as shown in FIG. 2.

FIG. 5, a graph, is the modeled D* performance for the back side device 35 as described in FIG. 3 having a detector region 55 as shown in detail in FIG. 2. A mathematical modeling was performed with a detector structure configured having a mirror shown in the back side illuminated position. The modeled detectivity in the 8 to 12 micron range for this specific detector structure as in FIG. 2, having a filament width of approximately 0.5 micron, a pitch of 3 microns, a film thickness of 0.5 microns and a mirror separation forming a resonant cavity of 1 micron is calculated, where the flux level in the 8 μ to 12 μ range used to calculate the D*g–r, was $10^{17}$ photons per second centimeter squared. These results are for a detector having a background limited operating temperature of 175° K. The D* calculations for a conventional photoconductor at the same flux levels as shown in FIG. 1 are that of the resonant detector. As shown in FIG. 5, the cross-hatched region 61 illustrates the temperatures between 150° K. and 225° K. having D* values above $10^{10}$ centimeters as predicted. These D* values are between factors of 5 to 10 times greater than the conventional detectors shown in FIG. 1 for the same detector's operation temperature range, 150° K. to 225° K. The three D* curves 62, 64 and 66 on each graph of FIG. 5 represent separate D* calculations due to separate noise sources, for example, the $D^*_{g-r}$th is the D* calculated as if the only noise voltage is the thermal generation recombination noise (g–r). The D* J represents the Johnson noise contribution to D* while $D^*_{g-r,op}$ represents the optical, g–r noise produced by the photoflux ($10^{17}$ photons/sec-cm$^2$) contribution to the D* calculation.

Table I below, lists the standard formulas used to calculate the various quantities of interest:

TABLE I

Formulas of Interest

Spectral Responsivity $$R\lambda = \frac{\lambda_1 E_t \xi}{n_o wdhc} \text{ volts/watt}$$

Johnson Noise Voltage $$V_J = \left\{ \frac{4KTl\Delta f}{e\mu_n n_o wd} \right\}^{1/2} \text{ volts}$$

Generation/Recombination Noise Voltage (Thermal)

$$V^{thermal}_{g-r} = \frac{2E}{n_o} \left\{ \frac{P_oN_o\xi \tau l\Delta f}{(n_o + P_o)wd} \right\}^{1/2} \text{ volts}$$

Generation/Recombination Noise Voltage (Optical)

$$V^{optical}_{g-r} = \frac{2E}{n_o} \left\{ \frac{Pb\xi \tau l\Delta f}{wd} \right\}^{1/2} \text{ volts}$$

Spectral Detectivity $$D^*_\lambda = \frac{R\lambda (A\Delta f)^{1/2}}{V_N} \text{ Cm/Hz}^{1/2}\text{ Watt}$$

Background-included $$P_b = \frac{NQ_B\xi \tau A}{lwd} \text{ cm}^{-3}$$

where:

$n_o$=intrinsic electron carrier concentrations A=Cell/Detector Area

Figure 7:
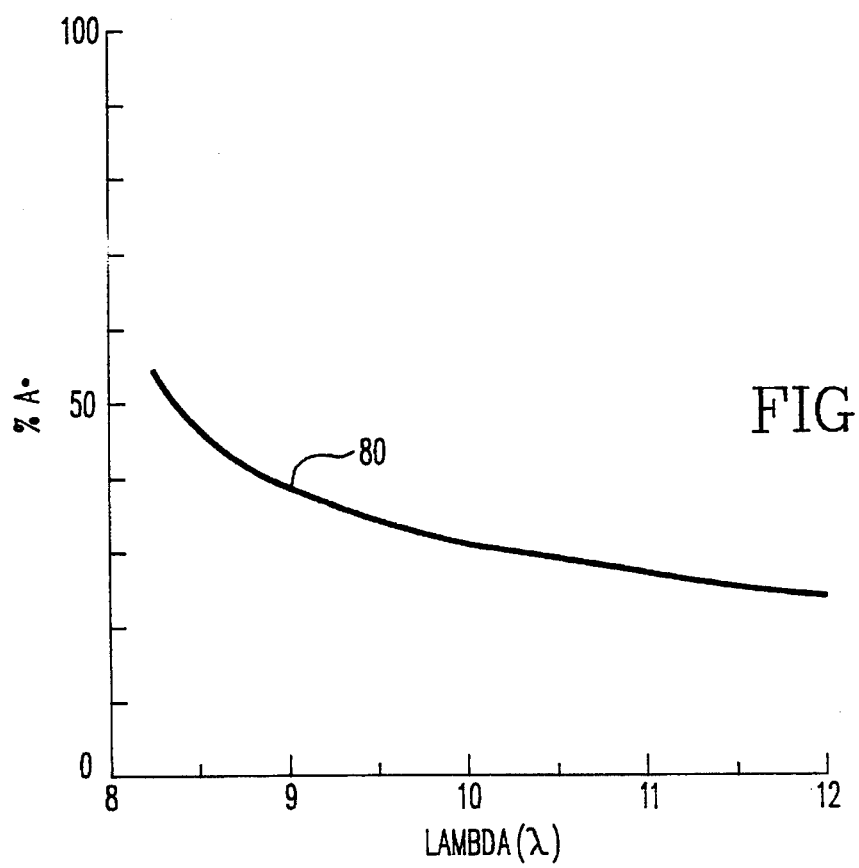
FIG. 7 is a graph of the average absorption versus wavelength for a 3 micron pitch, back surface illuminated detector shown in FIG. 2.

As shown in Table I above, minority carrier life times, majority carrier mobilities, carrier concentrations, diffusion and sweep out effects versus temperature have been calculated using standard theory. Absorption curves were calculated for the filament strip array structure 55, FIGS. 2 and 4, respectively, using specially modified software codes related to the structures of the type revealed here. Spectral absorptance for a filament structure having the parameters of 3 micron pitch between filaments of thickness of 0.5 micron and a mirror gap of 1 micron is also shown in FIG. 7. Note that there is a range of design geometrics around the specific numbers that yield and enhance absorption. The device configured in this paragraph is considered one of the better predicted performance values.

Figure 6:
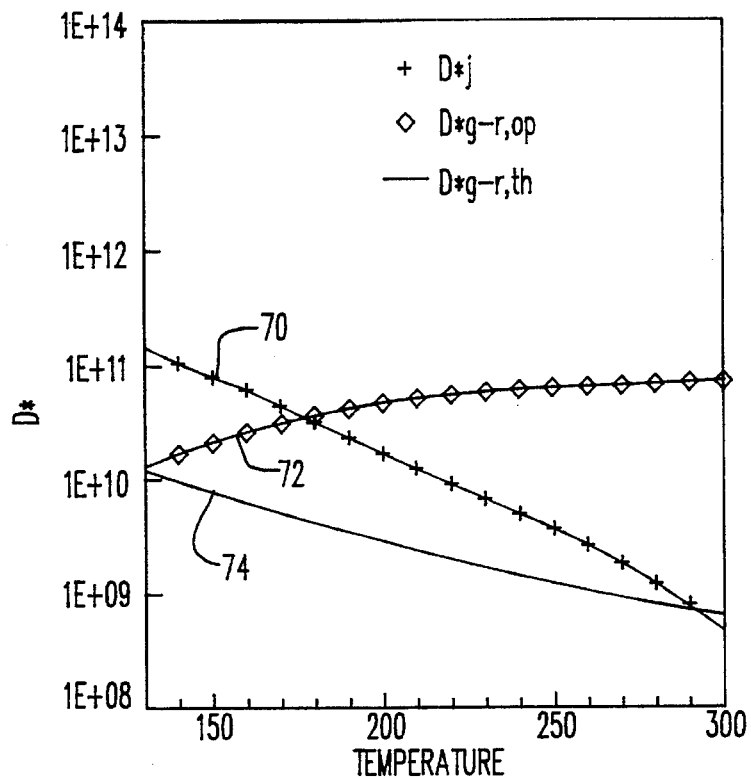
FIG. 6 is the modeled, graphed D* of a conventional, state-of-the-art, mercury cadmium telluride photoconductor as shown in FIG. 1.

FIG. 6 is a graph of the modeled D* of a conventional mercury cadmium telluride detector having the Johnson noise 70, as shown on this graph, the optical noise 72 and the thermal generation recombination noise, 74 plotted altogether as D* Versus temperature. Typical state of the art values for room temperature bolometers and pyroelectric detectors operating at similar flux levels at≦ 300 are ≦2×$10^8$ cm. As can be seen in FIG. 5 and in FIG. 6, the calculated performance shows an improvement of D* on the order $10^2$ over the other devices.

FIG. 7 is a graph of the non-linear 80 function of percent of average absorption versus the wavelength in micrometers of infrared energy under consideration for a back surface illuminated device. This specific graph is for a detector having a filament width and thickness of nominally 0.5 µ, a cavity depth of 1 µ between each filaments, with a pitch of 3 µ between each filament.

Figure 8:
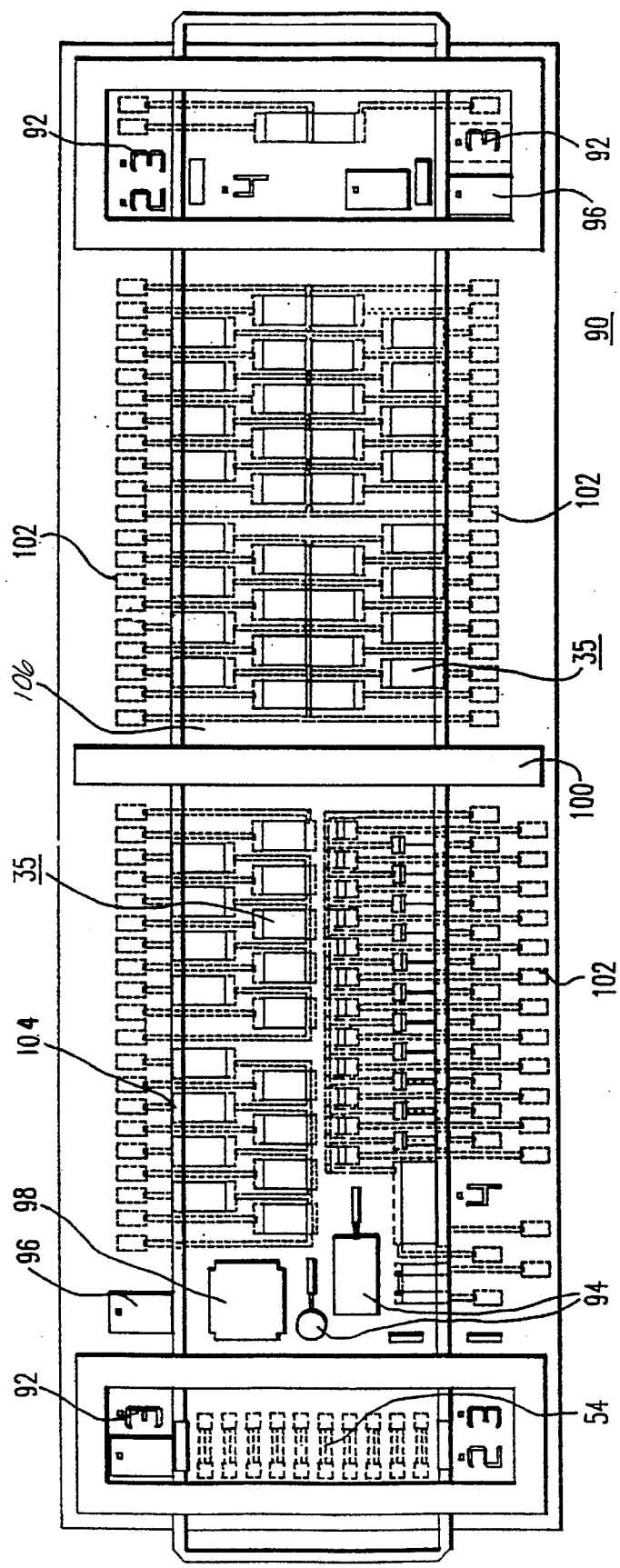
FIG. 8 is a plan view of the mask set for the mask required to process a sensor chip array, where the chip array comprises a multiplicity of back side, illuminated detectors.

FIG. 8 is a proposed mask set 90 for a test array of detectors that may be used in an array as pictured in the back side illuminated design 35 seen in FIGS. 2 and 3. This mask set 90 contains the mask required to process the sensor chip which would contain a mercury cadmium telluride filament structure and the back surface illuminated mirror chip. There are a variety of related filament structure designs included in this mask set as shown in FIG. 8. The strip array structure designs are all in the 200 micron by 200 micron detectors with the filament pitches center to center spacing being both 4 micron and 3 microns. Matrixed with these two pitched dimensions are filament widths which is typically 0.5 micron, 0.75 micron, 1 micron and 1.5 micron. As can be seen in this mask set 90, alignment marks 92 center the mask set 90. Capacitors for C–V measurements are configured as elements 94 upon the mask set 90 while the individual back side illuminated detectors 35 are laid out in configured arrays. Alignment marks for the masks for the various mask process manufacturing steps 96 allow the mask to be layered one upon the other, structure 98 serves as a resolution test pattern for the process and areas 100 for contact with the aluminum stops on the mirror substrate are provided. In such a configured array, electrical connectors 102 are conformed within the mask set to provide interconnection to circuitry outside of the detector array 90. A contact strip 104 can be found operable to test the devices during processing. Finally, a chrome mirror 106 operable to cover all of the detectors individually configured as 35 is shown. While this mask set, as shown in FIG. 8 is configured as an array for back surface devices, front surface devices may also be used in an array format.

Numerous variations will be made in the above-described combination and in different embodiments of this invention, they may be made without departing from the spirit thereof. Therefore, it is intended that all matter contained in the foregoing description and in the accompanying drawings, shall be interpreted as illustrative and thus not in a limiting sense.

We claim:

1. A back surface illuminated infrared detector, comprising:

a substrate, said substrate having a top and a bottom face, said substrate having an index of refraction whereby said substrate is transparent to received photons of infrared energy having a predetermined range of wavelengths;

a detector region, said detector region comprising a multiplicity of parallel, end connected, semiconductor filaments, said semiconductor filaments having predetermined length, width, and depth, further said semiconductor filaments having a predetermined pitch between each of said semiconductor filaments, said detector region resting upon said top face of said substrate, said detector region being operable to absorb said photons of infrared energy which pass through said substrate;

a reflective means, said reflective means mounted above the top face of said substrate over said detector region defining an open gap between said reflective means and said detector region, said reflective means operable to reflect said photons of infrared energy which are not absorbed by said detector region and which pass between said semiconductor filaments of said detector region;

a resonant cavity, said resonant cavity formed between said detector region and said reflective means mounted upon said substrate above said detector region, said resonant cavity being operable to produce a standing wave of said reflected photons of infrared energy; and at least one electrical contact means, said electrical contact means connected to said detector region.

2. A back surface illuminated infrared detector as in claim 1, wherein said substrate comprises CdTe.

3. A back surface illuminated infrared detector as in claim 1, wherein said semiconductor filaments comprises HgCdTe.

4. A back surface illuminated infrared detector as in claim 1, herein said reflective means is a highly reflective metal layer operable to reflect said photons of infrared energy.

5. A back surface illuminated infrared detector as in claim 1, wherein said electrical contact comprises Cr or Au or In depending on the detector material carrier type for HgCdTe.

6. A back surface illuminated infrared detector as in claim 1, wherein said substrate is transparent to received photons of infrared energy having a wavelength of a range of 8 microns to 12 microns.

7. A back surface illuminated infrared detector as in claim 1, wherein said reflective means further comprises a substrate of semiconductor material, said substrate being transparent to received photons of infrared energy of a predetermined wavelength, said substrate of said reflective means being supported above said detector region by posts of semiconductor material, said substrate of said reflective means having a metal layer on said substrate, said metal layer positioned above said detector region.

* * * * *